United States Patent
Marsh et al.

(10) Patent No.: US 7,462,780 B2
(45) Date of Patent: Dec. 9, 2008

(54) MOLDED ELECTRONIC ASSEMBLY

(75) Inventors: Charles W. Marsh, Aledo, TX (US);
Joseph R. Frissora, Aledo, TX (US)

(73) Assignee: Bell Helicopter Textron Inc., Hurst, TX (US)

( * ) Notice: Subject to any disclaimer, the term of this patent is extended or adjusted under 35 U.S.C. 154(b) by 0 days.

(21) Appl. No.: 10/761,815

(22) Filed: Jan. 20, 2004

(65) Prior Publication Data

US 2004/0206537 A1    Oct. 21, 2004

Related U.S. Application Data

(60) Provisional application No. 60/441,140, filed on Jan. 17, 2003.

(51) Int. Cl.
*H02G 3/04* (2006.01)

(52) U.S. Cl. .................. 174/72 A; 174/68.1; 174/59; 439/207

(58) Field of Classification Search ............. 174/59, 174/50, 51, 60, 53, 65 R, 72 A, 72 C, 72 R, 174/68.1, 68.3, 21 R, 96, 98; 439/607, 95, 439/188, 513, 650, 207
See application file for complete search history.

(56) References Cited

U.S. PATENT DOCUMENTS

| | | | | |
|---|---|---|---|---|
| 4,906,199 A | * | 3/1990 | Twomey et al. | 439/95 |
| 4,956,561 A | * | 9/1990 | Tamer | 307/10.1 |
| 5,013,872 A | * | 5/1991 | Lockwood et al. | 174/663 |
| 5,107,989 A | * | 4/1992 | Becker | 206/720 |
| 5,541,457 A | * | 7/1996 | Morrow | 307/38 |
| 5,764,487 A | * | 6/1998 | Natsume | 361/775 |
| 5,865,646 A | * | 2/1999 | Ortega et al. | 439/607 |
| 6,027,360 A | * | 2/2000 | Jenkins | 439/364 |
| 6,077,102 A | * | 6/2000 | Borzi et al. | 439/364 |
| 6,120,327 A | * | 9/2000 | O'Brien et al. | 439/623 |
| 6,213,612 B1 | * | 4/2001 | Schnell et al. | 359/877 |
| 7,186,915 B2 | * | 3/2007 | Hull et al. | 174/50 |
| 2005/0072589 A1 | * | 4/2005 | Hull et al. | 174/50 |

OTHER PUBLICATIONS

The Free Dictionary by Farlex, p. 1 of 3 (google).*

* cited by examiner

*Primary Examiner*—Dhiru R Patel
(74) *Attorney, Agent, or Firm*—Pillsbury Winthrop Shaw Pittman LLP

(57) ABSTRACT

A molded electronic assembly of the present invention includes a wiring harness with connectors connected thereto, and a molded body formed to encapsulate the wiring harness and provide access to the connectors. The molded may comprise a plastic material such as polyurethane or other moldable material. A conductive coating may be placed on the outer surface of the molded body to provide electrical shielding. Additionally, the wiring harness may be shielded with a wrapping of metallic tape or the like. The molded electronic assembly of the present invention may include a grounding fixture or grommet that provides mechanical properties of a structural fixture and allows for ground wires to be terminated.

21 Claims, 2 Drawing Sheets

MOLDED ELECTRONIC ASSEMBLY

CROSS-REFERENCE TO RELATED APPLICATION

The present application claims the benefit of Provisional Application No. 60/441,140, filed Jan. 17, 2003, and titled MOLDED ELECTRONIC ASSEMBLY.

FIELD OF THE INVENTION

The present invention relates generally to the field of electrical wiring assemblies, and more particularly to a molded electronic assembly for electrically interconnecting devices and wiring and bus systems in aircraft.

DESCRIPTION OF THE PRIOR ART

Currently, aircraft wiring and bus systems are implemented in integrated wiring systems. Integrated wiring systems include wiring harnesses and integrated wiring assemblies. Integrated wiring assemblies are used to interconnect wiring harnesses and to connect devices to the wiring harnesses.

A wiring integration assembly includes a metal chassis, typically of welded, brazed or cast construction, having one or more wiring harnesses disposed therein. Connectors are affixed to the chassis to provide connections to the wiring harnesses.

Wiring integration assemblies tend to be expensive, heavy, bulky, and subject to environmental constraints. Welded and brazed chassis construction involve many details, with expensive recurring process, and provide considerable variability in products. Cast chassis are expensive to make and have poor material properties. Cast chassis need thick walls in order to have sufficient mechanical strength. Thick walls lead to more material expense and weight. A shortcoming all current chassis constructions is that their robust box strength drives loads into the aircraft structure.

A further shortcoming of current integrated wiring assemblies is in their relatively part counts. Current integrated wiring assemblies include such parts as nut plates, retainers, screws, washers, covers, pads, seals, internal harnesses, relay panels, and strain reliefs. All of these parts increase the cost, weight and complexity of the integrated wiring assemblies.

Environmental shortcomings of current integrated wiring assemblies include internal accumulation of contaminates such as moisture, fluids, salts and particulates. All of these environmental contaminates can result in corrosion, shorting and other problems. Wiring integration assemblies in aircraft are also subject to vibrations. In most cases, the internal wiring harnesses are unsupported in the chassis. Vibration can lead to chafing and failure of wiring insulation, and loads and potential failure of wiring connections.

SUMMARY OF THE INVENTION

The present invention provides a molded electronic assembly. The molded electronic assembly of the present invention includes a wiring harness with connectors connected thereto, and a molded body formed to encapsulate the wiring harness and provide access to the connectors. The molded may comprise a plastic material such as polyurethane or other moldable material. A conductive coating may be placed on the outer surface of the molded body to provide electrical shielding. Additionally, the wiring harness may be shielded with a wrapping of metallic tape or the like. The molded electronic assembly of the present invention may include a grounding fixture or grommet that provides mechanical properties of a structural fixture and allows for ground wires to be terminated. The molded electronic assembly of the present invention has fewer parts and less volume, weighs and costs less, is more reliable and has less environmental susceptibility than the wiring integration assemblies of the prior art.

DESCRIPTION OF THE PREFERRED EMBODIMENT

Figure 1:
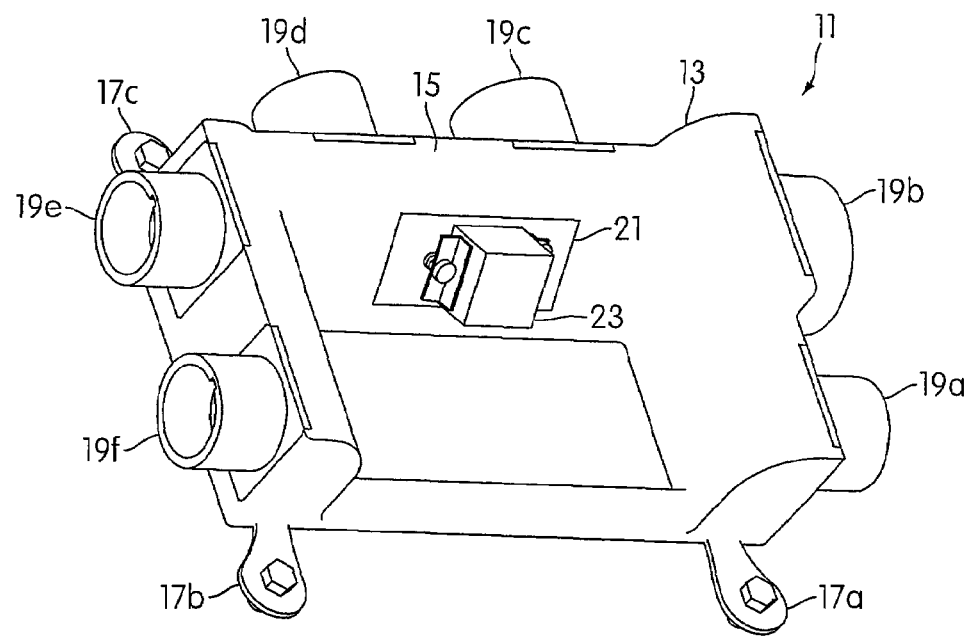
FIG. 1 is an isometric view of a molded wiring assembly according to the present invention.
Figure 2:
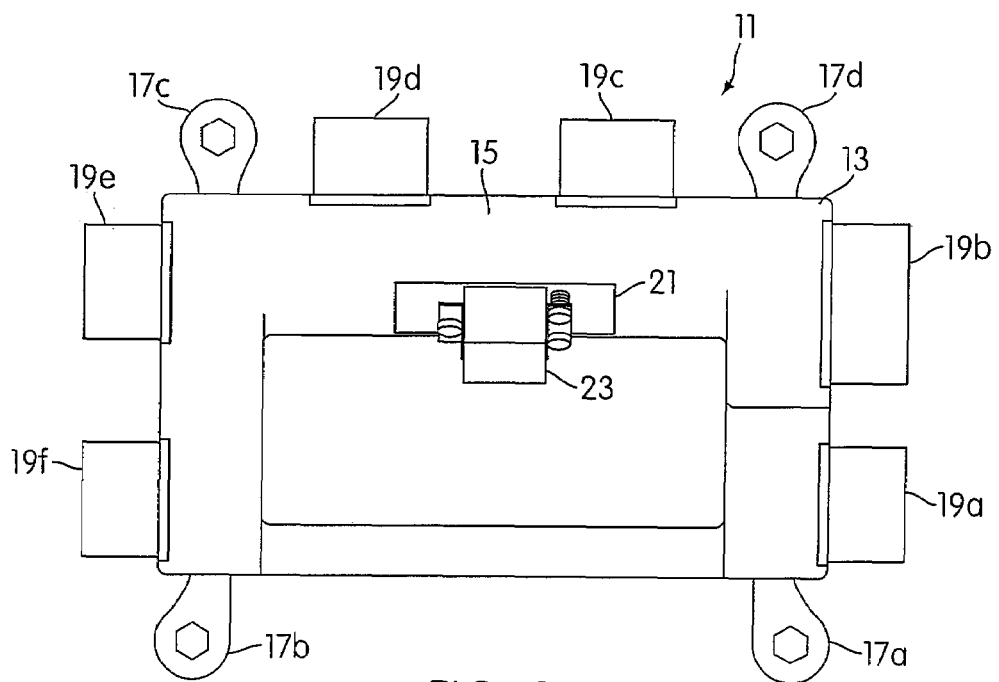
FIG. 2 is a top view of the molded wiring assembly of FIG. 1.

Referring now to the drawings, and first to FIGS. 1 and 2, a molded electronic assembly is designated generally by the numeral 11. Molded electronic assembly includes a molded body 13, which encapsulates one or more wiring harnesses (not shown in FIGS. 1 and 2) that will be described in detail with respect to FIGS. 3 and 4. Molded body 13 is formed from a moldable plastic material such as polyurethane. Other plastic materials such as Hexcell™, Hycor™, silicone or that like may be used to form molded body 13. The material of molded body 13 should have sufficient strength, hardness and other mechanical and electrical properties for use as a replacement for an aircraft integrated wiring assembly.

Molded body 13 may be covered with a conductive coating 15 to provide electrical shielding to the wiring harness or harnesses. A suitable conductive coating may be provided by a conductive paint, such a silver loaded composition. A conductive coating may also be provided by a metallic coating. For example, the coating 15 may be formed by electroplating or electroless plating the surface with of molded by 11 with copper or nickel. Those skilled in the art will recognize alternative materials and technologies for applying coating 15.

Molded electronic assembly 11 includes mounting fixtures 17 connected to molded body 13. Mounting fixtures 17 provide a means for attaching molded electronic assembly 11 to the structure of the aircraft. Mounting fixtures 17 may comprise metal straps, grommets, or the like, molded into molded body 13. For example, copper straps can extend between fixtures 17a and 17d and between fixtures 17b and 17c. Mounting fixtures 17 may also serve as ground connections to provide a conductive path to the structure of the aircraft. As shown in FIGS. 1 and 2 mounting fixtures 17 may include captive mounting hardware, such as bolts.

Molded electronic assembly 11 includes external connectors 19. As will discussed with respect to FIGS. 3 and 4, connectors 19 are connected to the wiring harness or harnesses encapsulated within molded body 13. Connectors 19 are of conventional construction and they may be molded into molded body 13, thereby not requiring separate fastening means as in the prior art. Connectors 19 may include integral strain reliefs.

Molded electronic assembly 11 may include a socket plate 21 molded into molded body 13. As will discussed with respect to FIGS. 3 and 4, socket plate is connected to the wiring harness or harnesses encapsulated within molded body 13. Socket plate 21 is adapted to have mounted thereto an external device, such as a relay box 23 or the like, and establish a connection between the external device and the internal wiring harness or harnesses.

Figure 3:
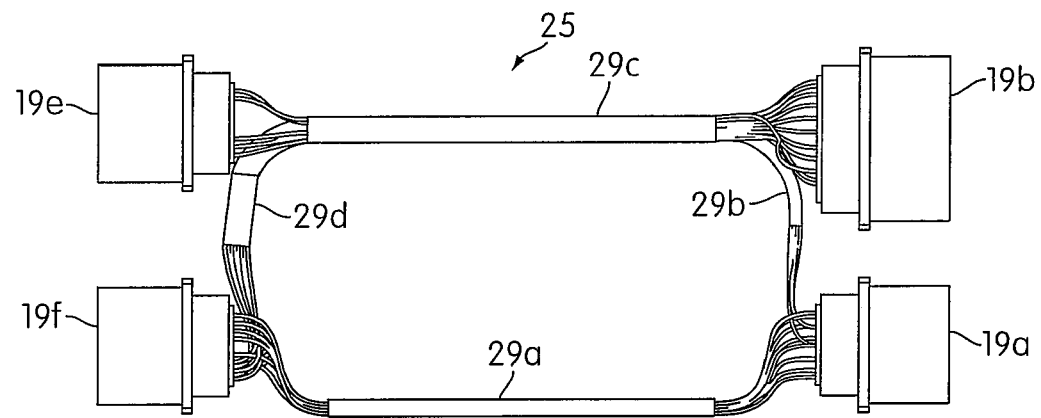
FIG. 3 is a top view of a first wiring harness according to the present invention.
Figure 4:
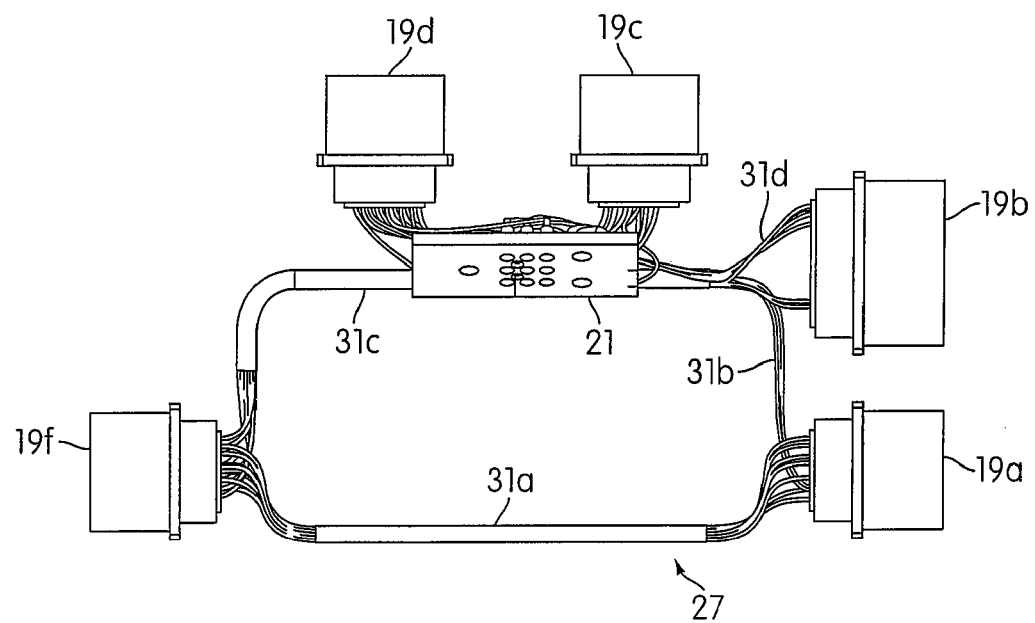
FIG. 4 is a top view of a second wiring harness according to the present invention.

Referring now to FIGS. 3 and 4, a first wiring harness is designated generally by the numeral 25 and a second wiring harness is designated generally by the numeral 27. As shown in FIGS. 3 and 4, both wiring harnesses 25 and 27 include some common connectors 19. Both wiring harnesses 25 and 27 are encapsulated with in molded body 13 as shown in FIGS. 1 and 2. Wiring harness 25 includes wiring bundles 29 that interconnect connectors 19a, 19b, 19e and 19f. Wiring bundles 29 may be covered with a shielding material such as metallic tape or foil. Wiring harness 27 includes wiring bundles 31 that interconnect connectors 19a, 19b, 19c, 19d and 19f, and socket plate 21. Wiring bundles 29 may be covered with a shielding material such as metallic tape or foil. It will be recognized that the connections illustrated in FIGS. 3 and 4 are by way of example and not of limitation. The connections are made to accomplish the electrical design objectives.

In construction, wiring bundles 29 and 31 are connected to connectors 19 and socket plate 21 as shown, for example in FIGS. 3 and 4. Wiring bundles 29 and 31, connectors 19 and socket plate 21 are then placed in a suitable mold (not shown). The straps or grommets of mounting fixtures 17 are also placed in the mold. The material of molded body 13 is then injected into the mold using know molding techniques. After the material of molded body 13 has cured, the mold is opened and molded electronic assembly 11 is removed. A conductive coating may then be applied to the surface of molded body 13.

From the foregoing, it may be seen that the molded electronic assembly of the present invention overcomes many of the shortcomings of the prior art. The system of the present invention eliminates the cost, size and weight associated with metallic chassis of the prior art. The wiring harnesses of the present invention are completely encapsulated and thereby isolated from the environment. The molded electronic assembly of the present invention eliminates most of the part count associated with integrated wiring assemblies of the prior art.

While the present invention has been described with reference to preferred embodiments, this description is not intended to be construed in a limiting sense. Various modifications and combinations of elements, as well as other embodiments of the invention, will be apparent to those skilled in the art given the benefit of this description.

What is claimed is:

1. An electronic assembly, which comprises:
    a wiring harness; connectors connected to the wiring harness; and, a body molded on the wiring harness to, simultaneously, completely encapsulate the wiring harness and at least part of the connectors, the body being molded on the wiring harness by injecting a material into a mold containing the wiring harness and the connectors and, after the material has cured, removing the molded body from the mold such that the body thus formed forms a one piece element that provides access to the connectors and insulates the wiring harness from the environment outside the electronic assembly.

2. The electronic assembly as claimed in claim 1, wherein the molded body comprises a plastic material.

3. The electronic assembly as claimed in claim 1, including a conductive coating on the outer surface of the molded body.

4. The electronic assembly as claimed in claim 3, wherein the conductive coating comprises a conductive paint.

5. The electronic assembly as claimed in claim 3, wherein the conductive coating comprises a metallic layer applied to the outer surface of the molded body.

6. The electronic assembly as claimed in claim 1, including a mounting fixture connected to the molded body.

7. The electronic assembly as claimed in claim 6, wherein the mounting fixture includes a ground connection.

8. The electronic assembly as claimed in claim 6, wherein the mounting fixtures are molded into the molded body.

9. The electronic assembly as claimed in claim 1, including a socket affixed to the molded body, the socket being connected to the wiring harness.

10. The electronic assembly as claimed in claim 9, wherein the socket is adapted to receive a relay.

11. The electronic assembly as claimed in claim 10, including the relay connected to said socket.

12. The electronic assembly as claimed in claim 1, including shielding for said wiring harness encapsulated within the molded body.

13. The electronic assembly as claimed in claim 12, wherein said shielding includes a conductive material surrounding the wiring harness.

14. The electronic assembly as claimed in claim 1, wherein said connectors are molded into the molded body.

15. The electronic assembly as claimed in claim 1, wherein said wiring harness includes a plurality of ends that are each connected to one of said connectors.

16. The electronic assembly as claimed in claim 15, wherein said wiring harness includes three ends.

17. An electronic assembly comprising:
    a plurality of connectors; a wiring harness connected to said plurality of connectors, and a body molded on the wiring harness with a material to, simultaneously, completely encapsulate said wiring harness and to cover a portion of each of said plurality of connectors so as to provide access to each of the plurality of connectors, the body being molded on the wiring harness by injecting the material into a mold containing the wiring harness and the connectors and, after the material has cured, removing the molded body from the mold, the body being molded on the wiring harness so as to form a one piece element that provides access to the connectors and insulates the wiring harness from the outside environment, the body including integrated fixtures that are configured to attach the electronic assembly to a support.

18. The electronic assembly as claimed in claim 17, wherein said molded body includes a base portion that extends between said plurality of connectors.

19. The electronic assembly as claimed in claim 18, further comprising a plurality of mounting fixtures that are molded into the molded body.

20. An electronic assembly comprising:
    a plurality of connectors; a wiring harness connected to said plurality of connectors, a body molded on the wiring harness to, simultaneously, completely encapsulate said wiring harness and to cover a portion of each of said plurality of connectors so as to provide access to each of the plurality of connectors, said molded body including a base portion that extends between said plurality of connectors, the body being molded on the wiring harness by injecting a material into a mold containing the wiring harness and the connectors and, after the material has cured, removing the molded body from the mold such that the body thus formed forms a one piece element that provides access to the connectors and insulated the wiring harness from the environment outside the electronic assembly; a socket plate affixed to the molded body, the socket being connected to the wiring harness, and a conductive coating on the outer surface of the molded body.

21. The electronic assembly as claimed in claim 20, wherein the molded body comprises a plastic material.

* * * * *